(12) United States Patent
Kimura et al.

(10) Patent No.: US 7,816,821 B2
(45) Date of Patent: Oct. 19, 2010

(54) METHOD FOR JUDGING A STATUS OF VARNISH IMPREGNATION

(75) Inventors: Hideaki Kimura, Okazaki (JP); Shingo Hashimoto, Anjo (JP)

(73) Assignee: Aisin AW Co., Ltd., Anjo (JP)

( * ) Notice: Subject to any disclaimer, the term of this patent is extended or adjusted under 35 U.S.C. 154(b) by 536 days.

(21) Appl. No.: 11/727,338

(22) Filed: Mar. 26, 2007

(65) Prior Publication Data

US 2007/0224338 A1 Sep. 27, 2007

(30) Foreign Application Priority Data

Mar. 27, 2006 (JP) .............................. 2006-085712

(51) Int. Cl.
*H02K 3/34* (2006.01)
*H02K 3/30* (2006.01)
*H02K 15/12* (2006.01)

(52) U.S. Cl. ........................... 310/45; 310/43; 427/104; 29/596; 29/598

(58) Field of Classification Search ................... 310/43, 310/45; 427/104; 29/596, 598; *H02K 3/34, H02K 15/12, 3/30*
See application file for complete search history.

(56) References Cited

U.S. PATENT DOCUMENTS

| | | | | |
|---|---|---|---|---|
| 3,728,465 A | * | 4/1973 | Yasui et al. | ............. 174/17 LF |
| 4,269,894 A | * | 5/1981 | Sakai et al. | ................. 428/377 |
| 4,616,407 A | * | 10/1986 | Tamaki et al. | ................. 310/45 |
| 5,416,373 A | * | 5/1995 | Maruyama et al. | ............ 310/45 |
| 6,874,325 B2 | * | 4/2005 | Suzuki et al. | ................ 310/215 |
| 7,019,422 B2 | * | 3/2006 | Neal et al. | ..................... 310/43 |

FOREIGN PATENT DOCUMENTS

| | | | | |
|---|---|---|---|---|
| JP | 57012512 A | * | 1/1982 | |
| JP | A-57-012512 | | 1/1982 | |
| JP | B2-04-0000375 | | 1/1992 | |
| JP | B2-3167479 | | 3/2001 | |
| JP | 2003189523 A | * | 7/2003 | |
| JP | A 2003-189523 | | 7/2003 | |

OTHER PUBLICATIONS

Ohashi et al., "Sogoteki na Zetsuen Kaifuku Shuho no Kenkyu," Rolling Stock & Machinery, vol. 12, No. 11, pp. 17-21, 2004.
Zhengyan et al., "A New Approach to Compatibility of Magnet Wire and Varnish Using Dielectrometry," Conference Record of the 1985 International Conference on Properties and Applications of Dielectric Materials, vol. 2, pp. 447-450, 1985.

* cited by examiner

*Primary Examiner*—Quyen Leung
*Assistant Examiner*—Michael Andrews
(74) *Attorney, Agent, or Firm*—Oliff & Berridge, PLC

(57) ABSTRACT

A varnish impregnation state determination method for determining a varnish impregnation state of a core assembly that is formed by disposing a coil inside a slot of a motor core and impregnating the coil and an interior of the slot with a varnish, including applying an alternating current voltage between the motor core and the coil to determine tan δ that serves as a dielectric dissipation factor; and determining that the varnish impregnation state of the core assembly is normal when a value of the tan δ is equal to or smaller than a predetermined non-defective article reference value.

9 Claims, 8 Drawing Sheets

METHOD FOR JUDGING A STATUS OF VARNISH IMPREGNATION

INCORPORATION BY REFERENCE

The disclosure of Japanese Patent Application No. 2006-085712 filed on Mar. 27, 2006, including the specification, drawings, and abstract, is incorporated herein by reference in its entirety.

BACKGROUND

The present invention relates to a method for determining the varnish impregnation state of a core assembly.

When manufacturing a motor, a coil formed by winding a magnet wire with insulating paper is inserted and disposed in a slot of a motor core formed by laminating together electromagnetic steel plates. Next, in a varnish impregnation process, varnish taking the form of a liquid thermosetting resin is dripped onto a coil end portion that forms a part of the coil that projects from an axial end surface of the motor core. Using the capillary action of the varnish, the interior of the slot of the motor core is filled with the varnish. The coil and motor core are then subjected to heating or the like to harden the varnish, and thus the core assembly is manufactured. A method of performing varnish drip-impregnation in this manner is disclosed in Japanese Patent Application Publication No. JP-A-2003-189523.

By filling the slot interior with varnish, the coils are fixed to each other, the coil and insulating paper are fixed to each other, and the insulating paper and motor core are fixed to each other by the varnish. As a result, an insulation coating on the magnet wire is protected from breakage caused by electromagnetic vibration during electrification of the coil and so on. Moreover, the varnish enhances the heat radiation property of the motor core, assists the insulating function, and so on.

SUMMARY

Incidentally, the rate at which the varnish is filled into the slot of the motor core (the impregnation ratio) is stabilized by managing the varnish drip amount and so on. However, varnish may drip down from the coil and become adhered to the axial end surface of the motor core and so on. It is therefore impossible to confirm the amount of varnish that has actually been filled into the slot (the impregnation ratio) simply by managing the varnish drip amount.

Therefore, to confirm the varnish impregnation ratio, a sample destructive test is performed. In this sample destructive test, any one core assembly under mass production is randomly selected, the core assembly is cut in an orthogonal direction to the axial direction of the motor core, and the varnish impregnation ratio is determined by determining the surface area of the gap in the slot on the cut surface using image processing.

However, when the sample destructive test described above is performed to test the varnish impregnation ratio, the core assembly on which the test is performed must be disposed of. Furthermore, the core assembly is cut in the test, and therefore a large amount of time is required for the test.

Also, when a core assembly is mass produced, it is impossible to test all of the core assemblies using a sample destructive test, and hence this method is insufficient for improving the testing precision of the varnish impregnation ratio.

The present invention thus provides, among other things, a varnish impregnation state determination method with which the varnish impregnation state can be tested using a non-destructive test and the precision of the varnish impregnation state test can be improved.

As exemplary aspect of the invention includes a varnish impregnation state determination method for determining a varnish impregnation state of a core assembly that is formed by disposing a coil inside a slot of a motor core and impregnating the coil and an interior of the slot with a varnish. The method includes the steps of applying an alternating current voltage between the motor core and the coil to determine tan $\delta$ that serves as a dielectric dissipation factor; and a determining that the varnish impregnation state of the core assembly is normal when a value of the tan $\delta$ is equal to or smaller than a predetermined non-defective article reference value.

BRIEF DESCRIPTION OF THE DRAWINGS

Various exemplary aspects of the invention will be described with reference to the drawings, wherein.

DETAILED DESCRIPTION OF EMBODIMENTS

A preferred embodiment of the present invention will now be described.

In the present invention, the relationship between the varnish impregnation ratio, which is the amount of impregnated varnish relative to a varnish impregnable gap in the slot of the motor core, and tan $\delta$ is determined in advance. When the value of tan $\delta$ is equal to or smaller than a predetermined non-defective article reference value, the varnish impregnation ratio is determined to be equal to or greater than a predetermined value.

In this case, when the value of tan $\delta$ is equal to or smaller than the non-defective article reference value, the fact that the slot in the motor core of the core assembly has been impregnated appropriately with the varnish can be confirmed easily.

Further, by determining the value of tan δ in the core assembly, the value of the varnish impregnation ratio in the slot in the motor core of the core assembly can be learned.

Note that the aforementioned varnish impregnable gap may be determined as a gap (a cavity) generated within the slot of the motor core when insertion members such as an insulation-coated coil and insulating paper are disposed in the slot. The varnish impregnation ratio may be determined as the amount of filled varnish relative to the size of the gap.

Further, the value of the varnish impregnation ratio may be determined as the varnish impregnation amount in an axial central position of the motor core.

During drip-impregnation of the varnish, varnish is dripped onto coil end portions projecting respectively from the two axial end surfaces of the motor core, and using the capillary action of the varnish, the varnish is filled into the slot of the motor core. It is then assumed that the varnish impregnation ratio will take its smallest (worst) value in the axial central position of the motor core.

Hence, with respect to the relationship between the varnish impregnation ratio and tan δ, by determining the value of the varnish impregnation ratio as the varnish impregnation amount (filling amount) in the axial central position of the motor core, it can be acknowledged that the varnish impregnation ratio in the most difficult position of the core assembly for the varnish to impregnate has reached or exceeded a predetermined value when the value of tan δ in the manufactured core assembly is equal to or smaller than the aforementioned non-defective article reference value.

An embodiment of the varnish impregnation state determination method according to the present invention will now be described with reference to the drawings.

Figure 1:
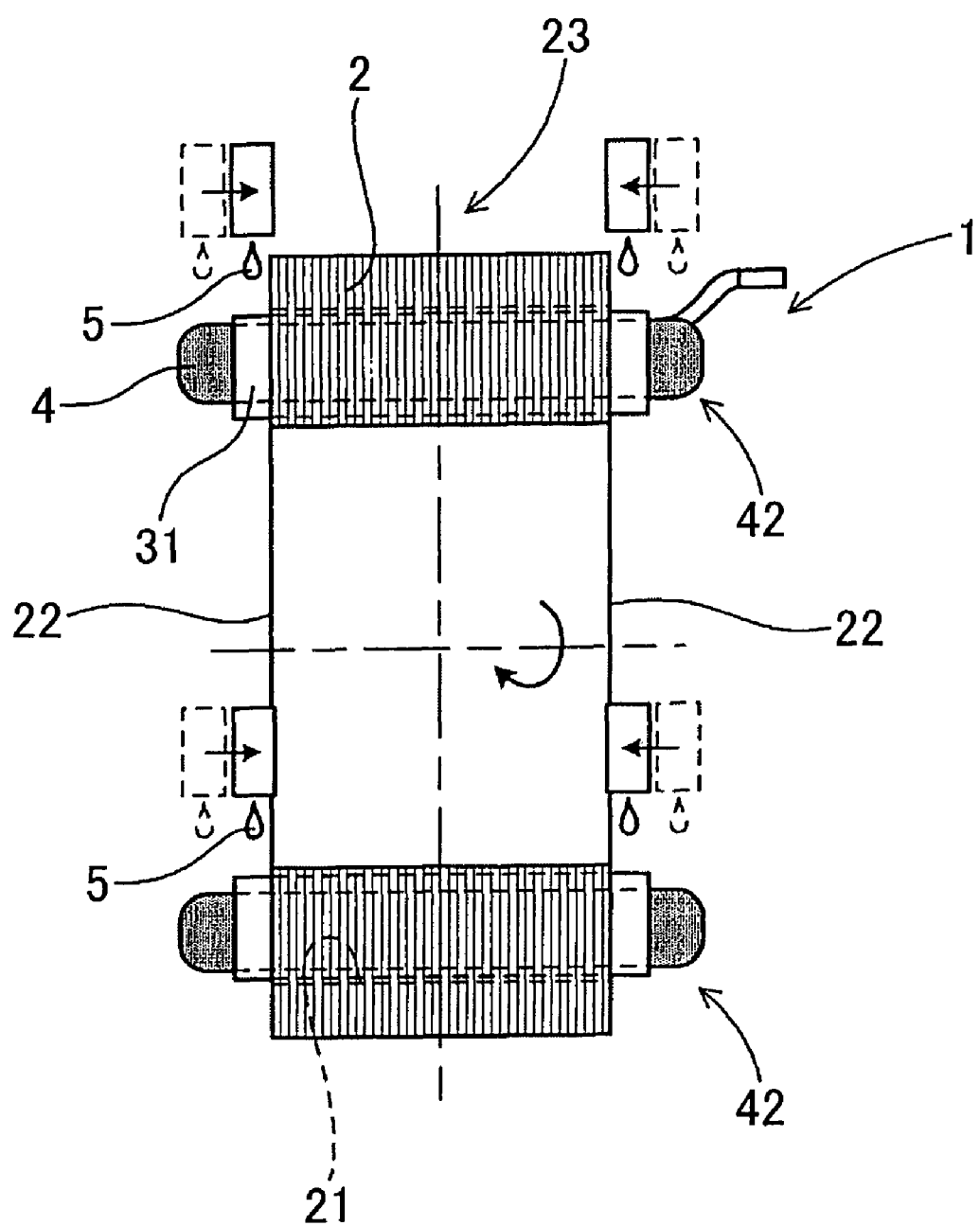
FIG. 1 is an explanatory sectional view showing a core assembly undergoing varnish impregnation, seen from an orthogonal direction to an axial direction, according to an embodiment.
Figure 2:
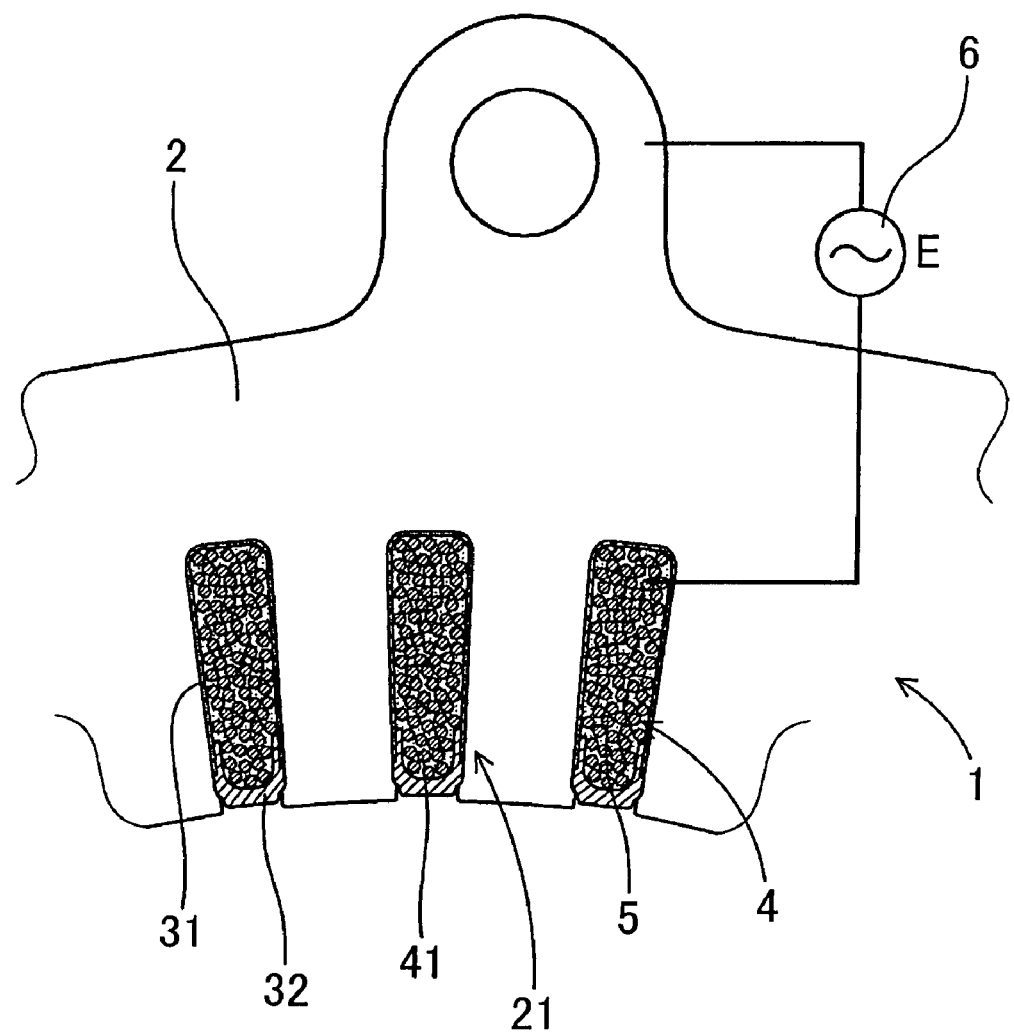
FIG. 2 is an explanatory sectional view of the core assembly undergoing alternating current voltage application, seen from the axial direction, according to this embodiment.

As shown in FIGS. 1 and 2, in the varnish impregnation state determination method of this embodiment, the quality of the varnish impregnation state of a core assembly 1 formed by disposing insulating paper 31 and a coil 4 inside a slot 21 of a motor core 2 and impregnating the coil 4 and the interior of the slot 21 with varnish is determined using a non-destructive test.

Figure 9:
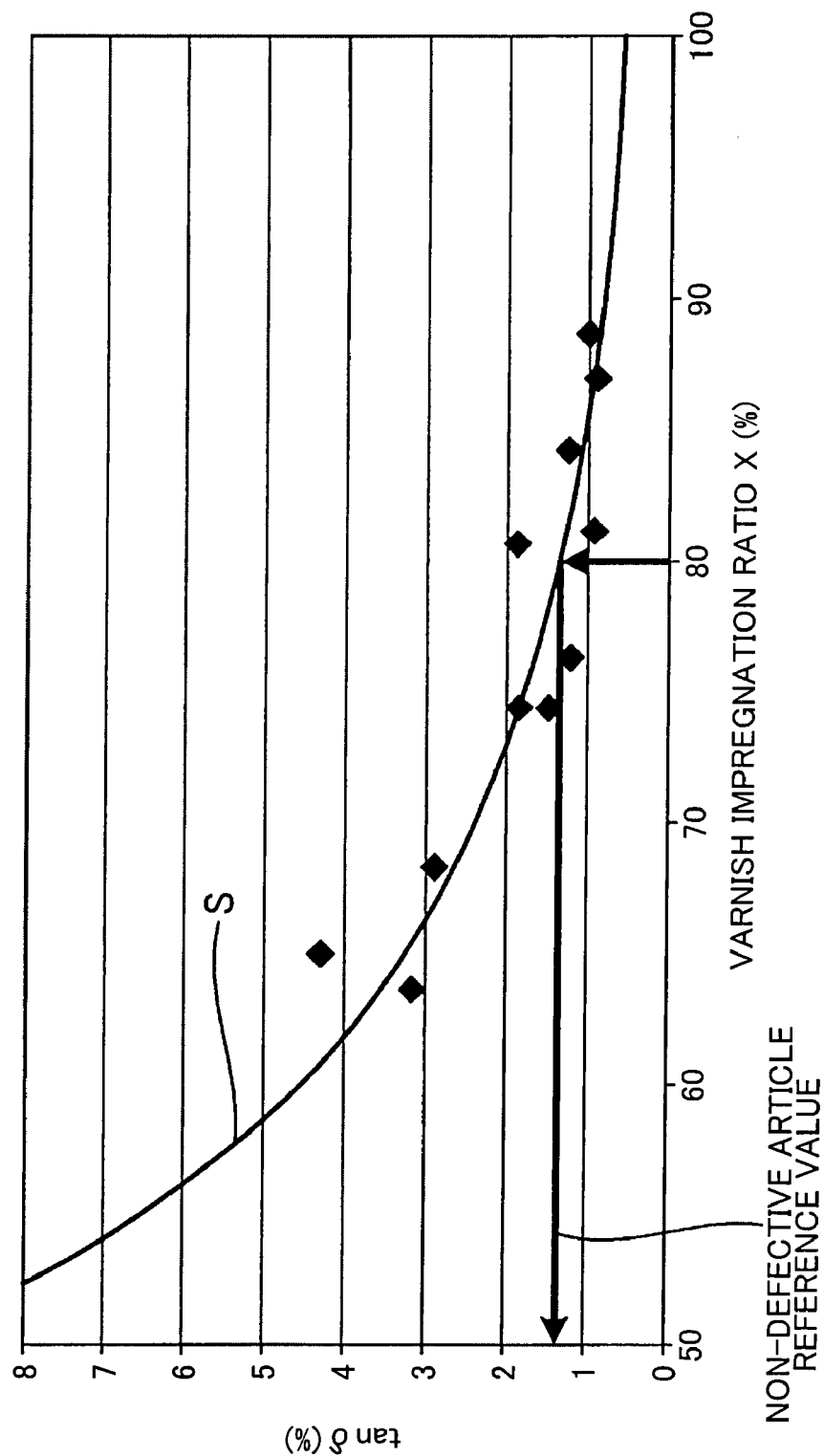
FIG. 9 is a graph showing the relationship between the varnish impregnation ratio and tan $\delta$, taking the former on the abscissa and the latter on the ordinate, according to this embodiment.

More specifically, as shown in FIG. 2, in the determination method of this embodiment, tan δ, which is the dielectric loss tangent of the core assembly 1, is determined by applying an alternating current voltage E to the core assembly 1 between the motor core 2 and the coil 4. As shown in FIG. 9, when the value of tan δ is equal to or smaller than a predetermined non-defective article reference value, it is determined that the varnish impregnation state of the core assembly 1 is normal.

The varnish impregnation state determination method of this embodiment will be described in detail below with reference to FIGS. 1 to 10.

Figure 3:
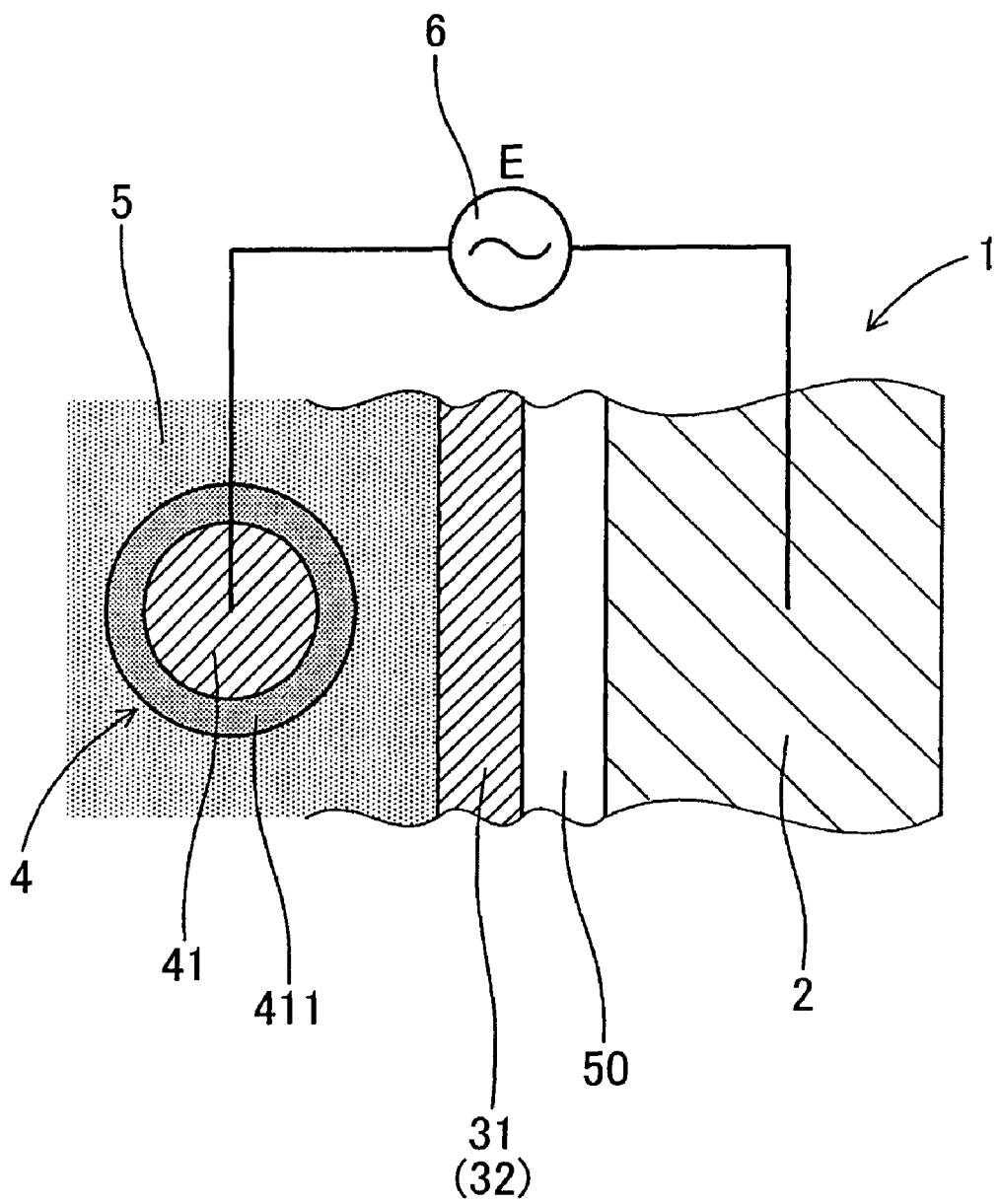
FIG. 3 is an explanatory drawing showing the core assembly undergoing alternating current voltage application, according to this embodiment.
Figure 5:
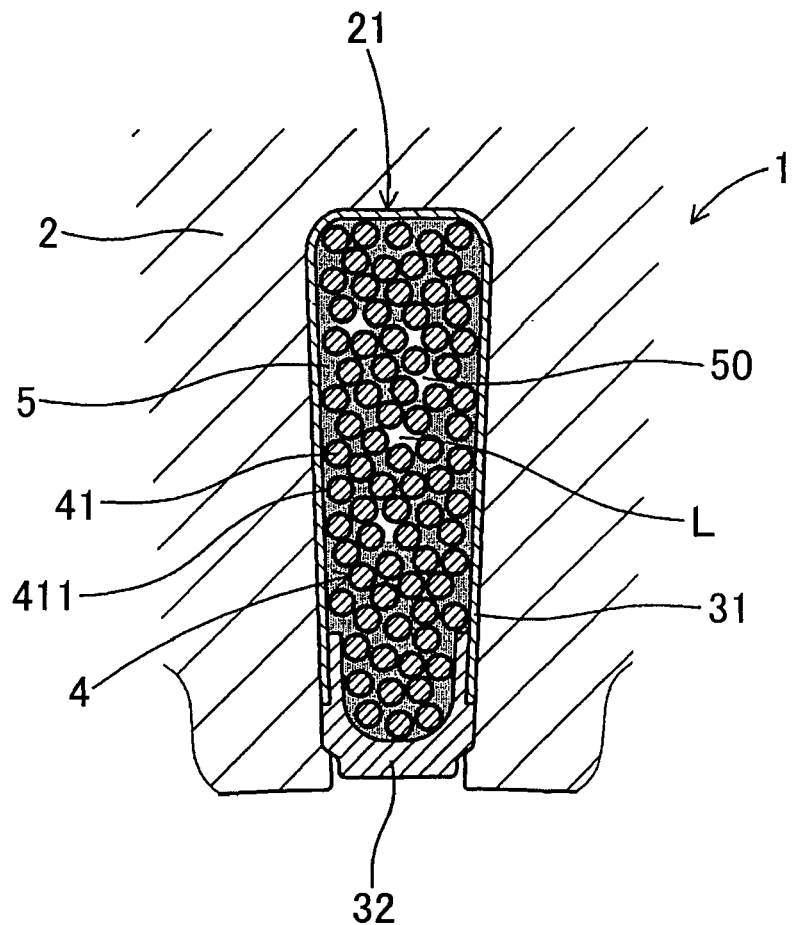
FIG. 5 is an explanatory sectional view used to explain a varnish impregnation ratio of the core assembly after varnish impregnation, according to this embodiment.

As shown in FIGS. 3 and 5, in the varnish impregnation state determination method of this embodiment, the varnish impregnation state of the core assembly 1 is determined by measuring the dielectric loss tangent (dielectric loss), tan δ, occurring in the core assembly 1 due to the existence of an insulation coating 411 on a magnet wire 41 of the coil 4, varnish 5, insulating paper 31, air 50, and so on between the motor core 2 and coil 4 when the alternating current voltage E is applied between the motor core 2 and coil 4.

The motor core 2 that is manufactured in this embodiment is a stator core 2 for a three phase motor, and the coil 4 that is inserted and disposed in the stator core 2 is a three phase coil 4 having a U phase, a V phase, and a W phase. Each coil 4 is formed by winding the insulation coated magnet wire 41.

To manufacture the core assembly 1, first, the insulating paper 31 is disposed inside the slot 21 of the stator core 2, then the coil 4 is inserted and disposed on the inside of the insulating paper 31, and then a wedge 32 including a thermosetting resin or the like is inserted and disposed in an opening portion of the slot 21.

Next, as shown in FIG. 1, the varnish 5, which is a liquid thermosetting resin, is dripped onto a coil end portion 42 projecting from each axial end surface 22 of the stator core 2, whereupon the coil 4 and the interior of the slot 21 are impregnated with the varnish 5 using the capillary action of the varnish 5. The dripped varnish 5 is then hardened by electrifying the coil 4 such that the coil 4 and stator core 2 are heated, and thus the core assembly 1 is manufactured. Note that the varnish is formed by melting thermosetting resin in a solvent, and when heated, a part of the solvent evaporates and a catalyst in the varnish generates a radical reaction. As a result, the thermosetting resin hardens.

Furthermore, when the coil 4 and stator core 2 are heated, moisture contained in the core assembly 1 can be evaporated.

In the varnish impregnation state determination method of this embodiment, the core assembly 1 is treated as a dielectric 10, and a tan δ tester for measuring the tan δ, which serves as the dielectric loss (dielectric loss tangent) of the dielectric 10, is used.

Figure 6:
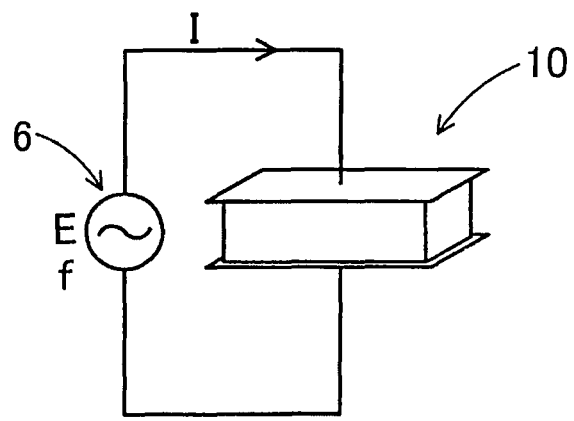
FIG. 6 is an explanatory drawing showing a state in which an alternating current voltage is applied to a dielectric, according to this embodiment.
Figure 7:
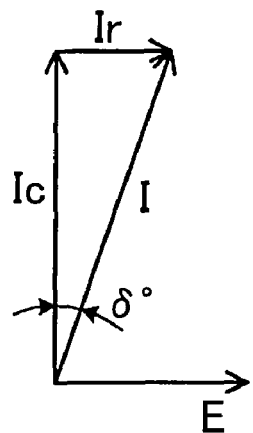
FIG. 7 is an explanatory drawing used to explain dielectric loss occurring in the dielectric, according to this embodiment.

The tan δ is calculated using the fact that when the alternating current voltage E having a frequency f is applied to the dielectric 10, as shown in FIG. 6, the phase of a current I flowing to the dielectric 10 advances 90° relative to the voltage generated in the dielectric 10 if there is no dielectric loss in the dielectric 10, as shown in FIG. 7, whereas a delay of δ° occurs in the phase of the current I flowing to the dielectric 10 if dielectric loss occurs in the dielectric 10.

Figure 8:
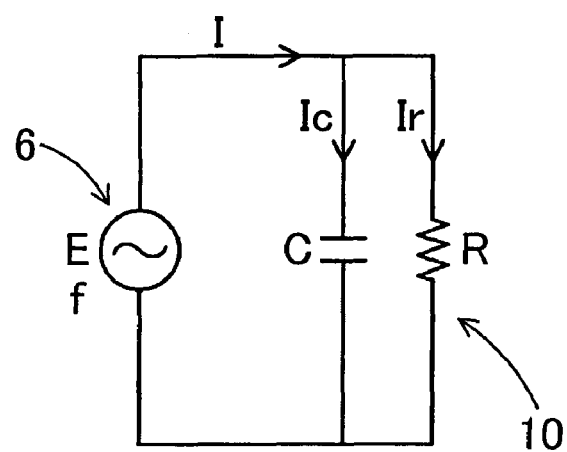
FIG. 8 is an explanatory drawing showing an equivalent circuit of the dielectric, according to this embodiment.

Further, as shown in FIG. 8, the dielectric 10 may be realized by an equivalent circuit in which a resistance having a resistance value R and a capacitor having a capacitance C are connected in series to a voltage source 6 of the alternating current voltage E. When a current flowing to the resistance is Ir and a current flowing to the capacitor is Ic, the tan δ can be determined from tan $\delta = Ir/Ic = 1/(2\pi fCR)$.

In this embodiment, a plurality of the core assembles 1 having different varnish drip amounts (adhesion amounts) are manufactured, and the impregnation amount of the varnish 5 in an axial central position 23 (see FIG. 1) of the stator core 2 in each core assembly 1 is determined as a varnish impregnation ratio X. Following varnish impregnation, the axial central position 23 of the stator core 2 in the core assembly 1 is cut, and the varnish impregnation ratio X is determined as the impregnation amount of the varnish 5 on the cut surface relative to a varnish impregnable gap K (see FIG. 4) in the slot 21 of the stator core 2.

Note that the axial central position 23 of the stator core 2 is the position furthest removed from a pair of coil end portions 42 projecting from the axial end surfaces 22 of the stator core 2, and is therefore considered to be the position in which varnish impregnation is most difficult. Hence, it is believed that by measuring the varnish impregnation ratio X in the axial central position 23 of the stator core 2, the minimum value of the varnish impregnation ratio X in the core assembly 1 can be measured.

Figure 4:
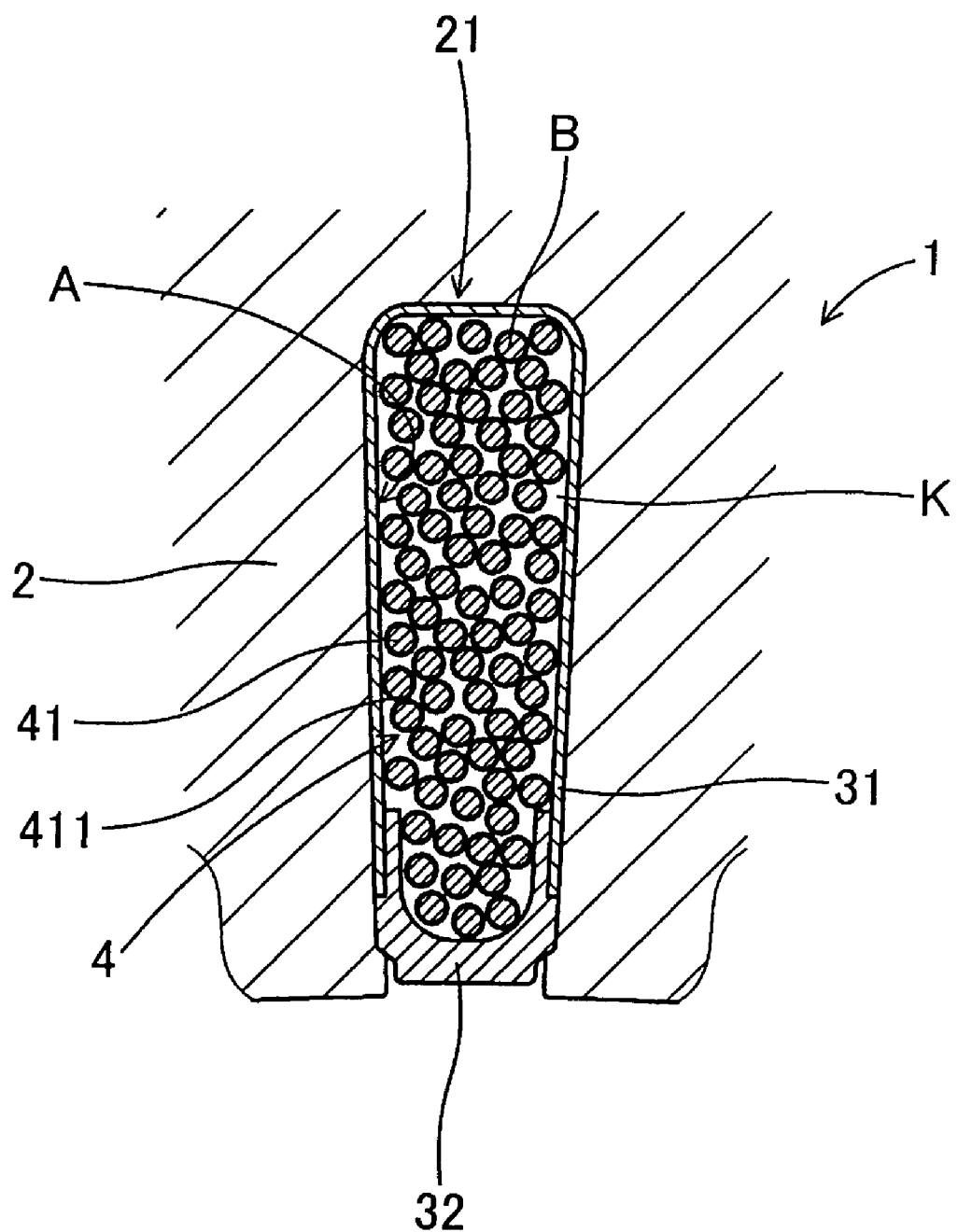
FIG. 4 is an explanatory sectional view used to explain a varnish impregnable gap in the core assembly prior to varnish impregnation, according to this embodiment.

More specifically, the varnish impregnable gap K is calculated as the surface area of the gap formed in the slot 21 on the cross-section of the axial central position 23 of the stator core 2 in the core assembly 1 prior to varnish impregnation. In other words, as shown in FIG. 4, the varnish impregnable gap K is calculated as a surface area K (K=A−B) of the cross-section of the axial central position 23 of the stator core 2 in the core assembly 1 prior to varnish impregnation when the coil 4 (the plurality of insulation coated magnet wires 41), the insulating paper 31, and the wedge 32 are disposed inside the slot 21 of the stator core 2, this surface area K being obtained by subtracting a surface area B occupied by the coil 4 from a surface area A of a space surrounded by the insulating paper 31 and the wedge 32.

The surface area K prior to varnish impregnation may be calculated from design values such as the surface area of the slot 21, the outer diameter and number of the magnet wires 41, the thickness of the insulating paper 31, and the position of the wedge 32.

Further, after the core assembly 1 has been impregnated with the varnish 5, a cavity 50 that is not filled with the varnish 5 is formed inside the slot 21 of the stator core 2, unless the varnish 5 is not filled entirely into the slot 21.

As shown in FIG. 5, when determining the varnish impregnation ratio X, the axial central position 23 of the stator core 2 in the varnish-impregnated core assembly 1 is cut, and image processing is performed on the cut surface to calculate a surface area L of the unfilled cavity 50. The varnish impregnation ratio X is determined from X=(K−L)/K×100%, where K−L is the surface area occupied by the varnish 5 relative to the varnish impregnable gap K.

Further, before cutting the core assembles 1 having different varnish drip amounts, the tan δ of each core assembly 1 is measured. As shown in FIG. 2, the tan δ is determined from tan δ=1/(2πfCR)×100% by applying the alternating current voltage E having the frequency f between the stator core 2 and the coil 4 (a lead terminal portion serving as an end portion of a winding) in the core assembly 1, and measuring the capacitance C of the core assembly 1 and the resistance value R of the core assembly 1.

FIG. 3 is a drawing showing in pattern diagram a state in which the alternating current voltage E is applied between the stator core 2 and the coil 4 (the magnet wire 41). As shown in the drawing, the insulation coating 411 on the magnet wire 41, the varnish 5, the insulating paper 31, and the cavity 50 exist between the stator core 2 and the coil 4. Hence, the tan δ can be measured by applying the alternating current voltage E, which generates corona discharge, between the stator core 2 and the coil 4.

As shown in FIG. 5, in the core assembly 1, the space between the stator core 2 and the coil 4 is insulated by the insulation coating 411 on the magnet wire 41 constituting the coil 4, the varnish 5, the insulating paper 31, and so on. Accordingly, the voltage value of the alternating current voltage E is set to or above the voltage value when corona discharge is generated in the core assembly 1. In this embodiment, corona discharge was generated upon application of an alternating current voltage E of 1.1 to 1.4 kV or more. Hence, for leeway, an alternating current voltage E of 1.6 kV was applied to the core assembly 1. Further, the frequency f of the alternating current voltage E was set at 60 Hz.

Note that the core assembly 1 of this embodiment is a stator core 2 for a three phase motor, and the alternating current voltage E was applied between the lead terminal portion of the three phase coil 4 and the stator core 2.

FIG. 9 shows results obtained by measuring the tan δ of the respective core assembles 1 having different varnish drip amounts of varnish 5. As shown in the drawing, the value of the varnish impregnation ratio X (%) and the value of the tan δ (%) were plotted on a graph and regression analysis was performed to obtain a relationship line S between the varnish impregnation ratio X and the tan δ. It can be seen from the relationship line S that as the varnish impregnation ratio X of the core assembly 1 increases, the value of the tan δ decreases.

Furthermore, in this embodiment the relationship line S is used as a relationship map between the varnish impregnation ratio X and the tan δ, and by measuring the tan δ of the core assembly 1 after varnish impregnation and estimating the varnish impregnation ratio X of the core assembly 1 therefrom, the quality of the varnish impregnation state of the core assembly 1 is determined.

Note that as the share of the varnish 5 increases, the permittivity of the varnish 5 becomes larger than the permittivity of the air 50 (when the permittivity of the air 50 is 1, the permittivity of the varnish 5 is approximately 3 to 4), and therefore it becomes easier to pass a current through the varnish 5 than through the air 50. Hence, it might be believed that as the share of the varnish 5 increases, the value of the tan δ increases. In actuality, however, the value of the tan δ decreases as the share of the varnish 5 increases. This is believed to be because leakage current generated from the coil 4 when the coil 4 is electrified decreases as the share of the varnish 5 increases, and as a result, the withstand voltage of the core assembly 1 increases.

Figure 10:
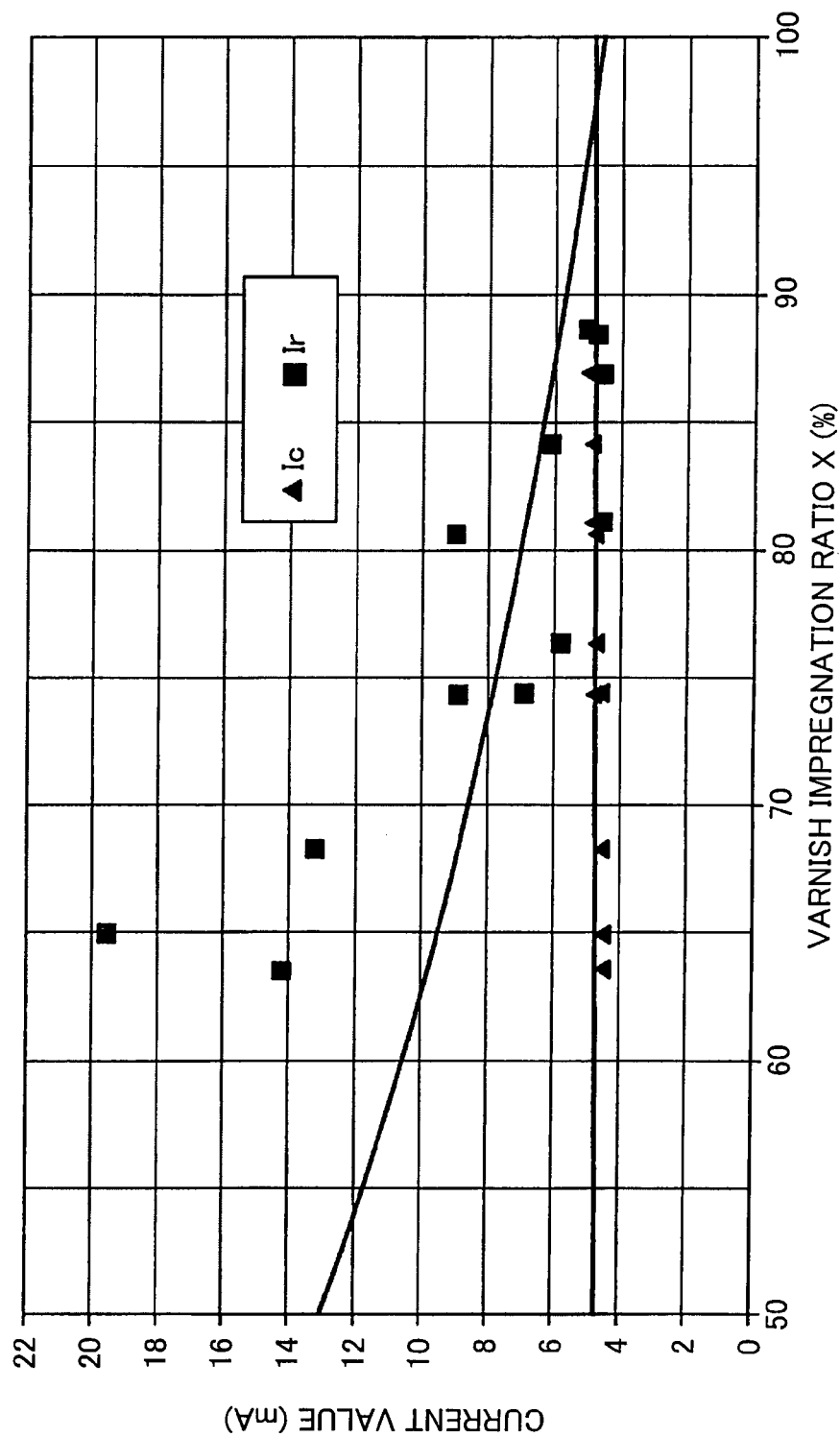
FIG. 10 is a graph showing a current flowing to a capacitor and a current flowing to a resistance, taking the varnish impregnation ratio on the abscissa and the current value on the ordinate, according to this embodiment.

For further reference, FIG. 10 shows results obtained by determining the relationship of the varnish impregnation ratio X (%) with the current Ic (mA) flowing to the capacitor in the equivalent circuit of the core assembly 1 and the current Ir (mA) flowing to the resistance in the equivalent circuit of the core assembly 1.

As shown in the drawing, it can be seen that the value of the current Ic of the core assembly 1 exhibits substantially no variation as the varnish impregnation ratio X changes, whereas the value of the current Ir of the core assembly 1 decreases as the varnish impregnation ratio X increases. Hence, it was learned that the tan δ varies greatly under the influence of variation in the current Ir of the core assembly 1.

In the varnish impregnation state determination method of this embodiment, the relationship map between the varnish impregnation ratio X (%) and the tan δ (%), determined in the manner described above, is used as shown in FIG. 9, and when the varnish impregnation ratio X is 80% or more, the core assembly 1 is determined to be non-defective (i.e., varnish impregnation is determined to have been performed correctly). Further, in the relationship map described above, the value of the tan δ when the varnish impregnation ratio X is 80% (approximately 1.3%) is used as the non-defective article reference value.

Note that the non-defective article reference value may be defined with a slight leeway in the tan δ value read from the relationship map.

The varnish impregnation ratio X of the core assembly 1 is estimated by measuring the tan δ of the core assembly 1 after varnish impregnation. When the value of the tan δ is equal to or below the non-defective article reference value, the varnish impregnation ratio X is equal to or above a predetermined value, and it is therefore recognized that varnish impregnation has been performed correctly in the core assembly 1.

When the varnish impregnation state determination method of this embodiment is used, there is no need to perform a sample destructive test to test the varnish impregnation state of the core assembly 1, and instead, a non-destructive test can be performed. Hence, there is no need to break the core assembly 1 during the process for manufacturing the core assembly 1, and moreover, the time required to test the varnish impregnation state can be shortened.

Furthermore, according to this embodiment, the varnish impregnation state can be tested using a non-destructive test, and therefore, during mass production of the core assembly 1, all of the core assemblies 1 can be tested.

Hence, according to the varnish impregnation state determination method of this embodiment, a non-destructive test can be performed, and the precision with which the varnish impregnation state is tested can be improved.

In the varnish impregnation state determination method of the present invention, an insulation coating on the surface of the coil, the varnish, insulating paper, air, and so on exist between the motor core and the coil in the core assembly, and therefore, the varnish impregnation state of the core assembly is determined by measuring the dielectric loss tangent (dielectric loss) that is generated when an alternating current voltage is applied between the motor core and the coil.

Incidentally, when the varnish filling ratio (impregnation ratio) of the interior of the slot in the motor core is small, the proportion of the gap (the proportion of air) in the slot increases, and when the varnish filling ratio of the interior of the slot in the motor core is large, the varnish proportion of the interior of the slot increases. The value of tan δ serving as the dielectric loss tangent varies under the influence of the ratio between the proportion of varnish and the proportion of air in the slot of the motor core.

In the present invention, a destructive test or the like is performed in advance on a plurality of core assembles having different varnish drip amounts to measure the varnish impregnation state of each core assembly and determine the value of tan δ when an alternating current voltage is applied to each core assembly. The value of tan δ when the varnish impregnation state is normal is defined in advance as the non-defective article reference value.

The core assembly is then manufactured, and to determine the quality of the varnish impregnation state in reality, the value of tan δ when an alternating current value is applied to the core assembly is measured.

In other words, when the tan δ value of the manufactured core assembly is equal to or smaller than the non-defective article reference value, the varnish impregnation state of the core assembly is determined to be normal, and when the tan δ value exceeds the non-defective article reference value, the varnish impregnation state of the core assembly is determined to be abnormal.

Therefore, when the varnish impregnation state determination method of the present invention is used, there is no need to perform a sample destructive test to test the varnish impregnation state of the core assembly, and instead, a non-destructive test may be performed. Hence, there is no need to break the core assembly during the process for manufacturing the core assembly, and moreover, the time required to test the varnish impregnation state can be shortened.

Furthermore, according to the present invention, the varnish impregnation state can be tested using a non-destructive test, and therefore, during mass production of the core assembly, all of the core assemblies can be tested.

Hence, according to the varnish impregnation state determination method of the present invention, a non-destructive test can be performed to test the varnish impregnation state, and the precision with which the varnish impregnation state is tested can be improved.

What is claimed is:

1. A varnish impregnation state determination method for determining a varnish impregnation state of a core assembly that is formed by disposing a coil inside a slot of a motor core and impregnating the coil and an interior of the slot with a varnish, comprising:

applying an alternating current voltage between the motor core and the coil to determine tan δ that serves as a dielectric dissipation factor, the tan δ being measured after the varnish is hardened, and determining that the varnish impregnation state of the core assembly is normal when a value of the tan δ is equal to or smaller than a predetermined non-defective article reference value, wherein:

a relationship between the tan δ and a varnish impregnation ratio, that is a varnish impregnation amount relative to a varnish impregnable gap inside the slot of the motor core, is determined in advance, when the value of the tan δ is equal to or smaller than the predetermined non-defective article reference value, the varnish impregnation ratio is determined to be equal to or greater than a predetermined value, the varnish is dripped onto a coil end portion projecting from each axial end surface of the motor core, and the dripped varnish is hardened by heating the coil and the motor core in order to form the core assembly, and a voltage value of the alternating current voltage is set to or above a voltage value when corona discharge is generated in the core assembly.

2. The varnish impregnation state determination method according to claim 1, wherein the varnish impregnation ratio is determined as the varnish impregnation amount in an axial central position of the motor core.

3. The varnish impregnation state determination method according to claim 1, wherein the varnish impregnable gap is determined as a gap within the slot of the motor core when the coil and insulation paper are disposed in the slot.

4. The varnish impregnation state determination method according to claim 1, wherein the motor core is a stator core for a three phase motor.

5. The varnish impregnation state determination method according to claim 1, wherein the tan δ is determined based on a current flowing to a resistance and a current flowing to a capacitor.

6. The varnish impregnation state determination method according to claim 1, wherein an insulating coating on a surface of the coil, the varnish, insulating paper and air exist between the motor core and the coil when applying the alternating current voltage.

7. The varnish impregnation state determination method according to claim 1, wherein the varnish impregnation state of the core assembly is determined in an axial central position of the motor core.

8. The varnish impregnation state determination method according to claim 1, wherein a voltage value of the alternating current voltage is set to or above a voltage value when corona discharge is generated in the core assembly.

9. The varnish impregnation state determination method according to claim 1, wherein the varnish impregnation state of the core assembly is determined to be normal when the value of the tan δ is smaller than the predetermined non-defective article reference value.

* * * * *